US012022744B2

(12) United States Patent
Kim et al.

(10) Patent No.: US 12,022,744 B2
(45) Date of Patent: Jun. 25, 2024

(54) CORE MAGNETIZATION REVERSAL METHOD OF SKYRMION AND DATA STORAGE DEVICE USING THE METHOD

(71) Applicants: SEOUL NATIONAL UNIVERSITY R&DB FOUNDATION, Seoul (KR); SAMSUNG ELECTRONICS CO., LTD., Suwon-si (KR)

(72) Inventors: Sang Koog Kim, Seongnam-si (KR); Jae Hak Yang, Yongin-si (KR); Yoon Jong Song, Suwon-si (KR); Kil Ho Lee, Suwon-si (KR); Jun Hoe Kim, Suwon-si (KR)

(73) Assignees: SEOUL NATIONAL UNIVERSITY R&DB FOUNDATION, Seoul (KR); SAMSUNG ELECTRONICS CO., LTD., Suwon-si (KR)

( * ) Notice: Subject to any disclaimer, the term of this patent is extended or adjusted under 35 U.S.C. 154(b) by 440 days.

(21) Appl. No.: 17/469,502

(22) Filed: Sep. 8, 2021

(65) Prior Publication Data
US 2022/0384717 A1 Dec. 1, 2022

(30) Foreign Application Priority Data
May 28, 2021 (KR) ......................... 10-2021-0069421

(51) Int. Cl.
*H10N 50/85* (2023.01)
*G11C 11/16* (2006.01)
(Continued)

(52) U.S. Cl.
CPC ........... *H10N 50/85* (2023.02); *G11C 11/161* (2013.01); *G11C 11/1675* (2013.01);
(Continued)

(58) Field of Classification Search
CPC ........ H10N 50/85; H10N 50/80; H10N 52/00; H10N 50/01; H10N 50/10; G11C 11/1675;
(Continued)

(56) References Cited

FOREIGN PATENT DOCUMENTS

| JP | 2012232324 A | 11/2012 |
| KR | 20180009643 A | 1/2018 |
| WO | 2015125708 A1 | 8/2015 |

OTHER PUBLICATIONS

Heo, C., Kiselev, N., Nandy, A. et al. Switching of chiral magnetic skyrmions by picosecond magnetic field pulses via transient topological states. Sci Rep 6, 27146 (2016). (Year: 2016).*
(Continued)

*Primary Examiner* — Ajay Ojha
(74) *Attorney, Agent, or Firm* — Myers Bigel, P.A.

(57) ABSTRACT

A core magnetization reversal method includes transforming the first magnetic skyrmion into a skyrmionium by applying a first alternating current (AC) magnetic field to the first magnetic skyrmion, and then transforming the skyrmionium into a second magnetic skyrmion by applying a second AC magnetic field to the skyrmionium. The first magnetic skyrmion may be formed on a hemispherical shell, which may be formed by (i) preparing a membrane having a plurality of protrusions, and (ii) stacking, on the membrane, a first layer including at least one of platinum (Pt), nickel (Ni), and palladium (Pd), and a second layer including a ferromagnetic material. The first and second AC magnetic fields may have different frequencies.

14 Claims, 19 Drawing Sheets

(51) Int. Cl.
  *H01F 10/32* (2006.01)
  *H10B 61/00* (2023.01)
  *H10N 50/80* (2023.01)
  *H10N 52/00* (2023.01)

(52) U.S. Cl.
  CPC ......... *H01F 10/3286* (2013.01); *H10B 61/00* (2023.02); *H10N 50/80* (2023.02); *H10N 52/00* (2023.02)

(58) Field of Classification Search
  CPC ... G11C 11/161; H10B 61/00; H01F 10/3286; H01F 41/32; H01F 10/123; H01F 10/32
  See application file for complete search history.

(56) References Cited

OTHER PUBLICATIONS

Zhang et al., Direct Imaging of a Zero-Field Target Skyrmion and its Polarity Switch in a Chiral Magnetic Nanodisk, Phys. Rev. Lett. 119, 197205—Published Nov. 10, 2017 (Year: 2017).*
Mehmood et al., Strain-mediated electric manipulation of magnetic skyrmion and other topological states in geometric confined nanodiscs, J. Phys. D: Appl. Phys. 53 (2020) (Year: 2020).*
Wang et al., Rapid creation and reversal of skyrmion in spin-valve nanopillars, Journal of Magnetism and Magnetic Materials 474 (2019) 472-476 (Year: 2019).*
Jiang et al., Skyrmions in Magnetic Multilayers, https://arxiv.org/pdf/1706.08295, 2017 (Year: 2017).*
Streubel et al., Magnetism in curved geometries, J. Phys. D: Appl. Phys. 49 (2016) (Year: 2016).*
Pylypovskyi et al. "Chiral Skyrmion and Skyrmionium States Engineered by the Gradient of Curvature" Physical Review Applied 10(6):064057 (Dec. 2018).
Vigo-Cotrina et al. "Switching of skyrmioniums induced by oscillating magnetic field pulses" Journal of Magnetism and Magnetic Materials 509:166895 (Sep. 1, 2020).

* cited by examiner

Hemispherical shell

① Skyrmion (S ≈ 1)

② Skyrmionium (S ≈ 0)

③ Vortex (S ≈ 1/2)

④ Uniform state (S ≈ 0)

(a) applied magnetic field
(b) surface-normal magnetization components $m_r$
(c) corresponding skyrmion number S
(d) resultant energy change of a system

CORE MAGNETIZATION REVERSAL METHOD OF SKYRMION AND DATA STORAGE DEVICE USING THE METHOD

REFERENCE TO PRIORITY APPLICATION

This application claims priority to Korean Patent Application No. 10-2021-0069421, filed May 28, 2021, the disclosure of which is hereby incorporated herein by reference.

BACKGROUND

1. Field of the Invention

The present invention relates to skyrmion core magnetization reversal methods and data storage devices using the methods.

2. Description of the Related Art

An electron has an electrical charge and a magnetic spin. A magnetic memory device, such as a hard disk, records a direction of the spin and uses the same as a digital logic "bit", the smallest unit of data handled by a computer. A memory device based on spin direction may generally store data without a power supply, but currently used devices generally have relatively low operating speed because of the structural properties associated with the materials used therein. In addition, although a memory device using magnetic domain walls has been proposed, its use is generally limited because a high current density is typically required to move the magnetic domain walls.

To solve these problems, high-speed and low-power magnetic memory devices using skyrmions has attracted significant attention. A skyrmion indicates a magnetic structure consisting of electron spins arranged in a vortex shape. The skyrmions may: (i) move at a very low current density (~$10^6$ A/m$^2$) corresponding to about $1/100,000$ of that required for other magnetic structures, and (ii) have a small size of several hundred nm. Accordingly, skyrmions have attracted significant attention as potential materials for high-speed and low-power next-generation magnetic memory devices. However, to use skyrmions for a memory device, the size, vortex direction, alignment, etc. of the skyrmions need to be controlled to enable signal transmission. For example, Japanese Patent Application No. JP 2012-232324 discloses a method of applying currents to a skyrmion. In addition, PCT Patent Publication No. WO2015125708A1, entitled "*Magnetic element and skyrmion memory*," discloses a memory device using skyrmion memory cell elements.

A skyrmion, which is generally formed on a plane, induces the skyrmion Hall effect due to structural properties thereof (i.e., a skyrmion number of S=1 or -1). Because of the skyrmion Hall effect, when driven by a spin-polarized current, the skyrmion is biased to the edge of a racetrack memory (a/k/a domain-wall memory) and thus a desired logic operation is disabled. A skyrmionium consisting of two skyrmions has a skyrmion number of S=0 and a total topological charge of 0, which compensates for the skyrmion Hall effect, and moves linearly along a nanotrack under the action of a spin current. However, the skyrmionium is not easily applicable because a high interfacial Dzyaloshinskii-Moriya interaction (DMI) value is required to stabilize the skyrmionic structure. Moreover, a method of transmitting a signal by propagating gyration of a core to align magnetic vortices has been proposed. However, signal transmission is achieved only by dipole-to-dipole interaction, the intensity and speed of signal transmission are not high, and magnetic vortices having a size of several hundred nm to several μm are not easily, highly, integrated even when the speed is high.

SUMMARY OF THE INVENTION

The present invention provides a method of achieving a core magnetization reversal method of a skyrmion. The method is capable of increasing the stability of a skyrmion based on a reduction in effective perpendicular magnetic anisotropy (PMA), and an increase in effective DMI due to a curvature, and a data storage device using the method. The present invention also provides a core magnetization reversal method of a skyrmion, with the method being capable of reversing core magnetization of the skyrmion formed on a hemispherical shell, within a short driving time by using low energy, and a data storage device using the method.

According to an embodiment of the present invention, there is provided a core magnetization reversal method of a magnetic skyrmion. The method includes: (i) preparing a first skyrmion formed on a hemispherical shell, (ii) transforming the first skyrmion into a skyrmionium by applying a first alternating current (AC) magnetic field thereto, and (iii) transforming the skyrmionium into a second skyrmion by applying a second AC magnetic field thereto.

In some of these embodiments, the hemispherical shell may be produced by preparing a membrane having a plurality of protrusions, and stacking, on the membrane, a first layer including platinum (Pt), nickel (Ni), or palladium (Pd) and a second layer including a ferromagnetic material. In additional embodiments, the membrane may be formed by placing a spherical particle on a porous membrane. In addition, the hemispherical shell may have a diameter less than or equal to 100 nm (and greater than 0 nm). Stability of the skyrmion may be increased when a curvature of the hemispherical shell is increased.

In further embodiments, the first skyrmion may have a skyrmion number of +1, the second skyrmion may have a skyrmion number of −1, and the skyrmionium may have a skyrmion number of 0. A related Dzyaloshinskii-Moriya interaction (DMI) constant may be greater than or equal to 0 mJ/m$^2$ and less than or equal to 3.0 mJ/m$^2$. A magnetic anisotropic constant $K_u$ may be greater than 0 MJ/m$^3$ and less than or equal to 0.8 MJ/m$^3$. And, on the hemispherical shell, an effective perpendicular magnetic anisotropy (PMA) $K_{eff}$ may be expressed as $K_{eff}=K_u-\frac{1}{2}\mu_0 M_s^2-D_{int}/R-A_{ex}/R^2$, and an effective DMI $D_{eff}$ may be expressed as $D_{eff}=D_{int}+2A_{ex}/R$, where $K_u$ denotes a PMA constant, $D_{int}$ denotes a DMI constant, $A_{ex}$ denotes an exchange stiffness, and R denotes a radius of the hemispherical shell. The first and second AC magnetic fields may have different frequencies, and the first and second AC magnetic fields may have a strength less than or equal to 1,000 Oe (and greater than 0 Oe) and a frequency ranging from 1 MHz to 99 GHz.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
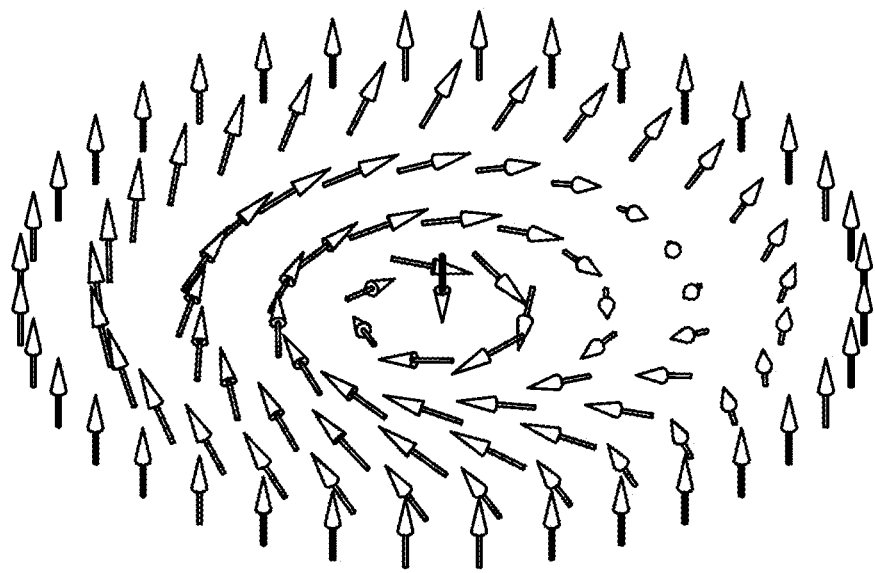
FIG. 1 shows a skyrmion structure according to an embodiment of the present invention.

The following detailed description of the invention will be made with reference to the accompanying drawings illustrating specific embodiments of the invention by way of example. These embodiments will be described in sufficient detail such that the invention may be carried out by one of ordinary skill in the art. It should be understood that various embodiments of the invention are different, but are not necessarily mutually exclusive. For example, a specific shape, structure, or characteristic described in relation to an embodiment may be implemented as another embodiment without departing from the scope of the invention. In addition, it should be understood that positions or arrangements of individual elements in each disclosed embodiment may be changed without departing from the scope of the invention. Therefore, the following detailed description should not be construed as being restrictive and, if appropriately described, the scope of the invention is defined only by the appended claims and equivalents thereof. In the drawings, like reference numerals denote like functions, and the dimensions such as lengths, areas, and thicknesses may be exaggerated for clarity.

Hereinafter, the present invention will be described in detail by explaining embodiments of the invention with reference to the attached drawings, such that one of ordinary skill in the art may easily carry out the invention.

Skyrmion Structure and Eigenmodes

FIG. 1 shows a skyrmion structure according to an embodiment of the present invention. As understood by those skilled in the art, a skyrmion is a spin structure having a vortex shape, and is characterized in that a center spin and a surrounding spin of the skyrmion are antiparallel to each other and a spin between the center spin and the surrounding spin is made in a vortex shape. A structure in which magnetization around a core gyrates in a clockwise (CW) (or counterclockwise (CCW)) direction as illustrated in FIG. 1 is called a Bloch skyrmion (or a spiral skyrmion), and a structure in which magnetization around a core is exhibited in a radial direction is called a Neel skyrmion (or a hedgehog skyrmion). Although the Neel skyrmion is representatively described below as an example, it should be noted that the present invention is also applicable to the Bloch skyrmion.

The type of the skyrmion is determined based on a mechanism by which Dzyaloshinskii-Moriya interaction (DMI) is formed. The Bloch skyrmion may be formed by a crystal structure, and the Neel skyrmion may be formed by an interface. A core (i.e., a center spin) having a perpendicular magnetization direction opposite to that of a surrounding spin is present at the center of the skyrmion structure, and this structure has stability due to topological specificity thereof. The skyrmion has a quite small radius of several to several ten nm and has properties of a stable particle, and thus are applicable to highly-integrated computing devices and magnetic memory devices. When a magnetic field or a current is applied to the skyrmion, eigenmodes may be excited. The eigenmodes may be classified into a breathing mode and a CW (or CCW) mode.

Figure 2A:
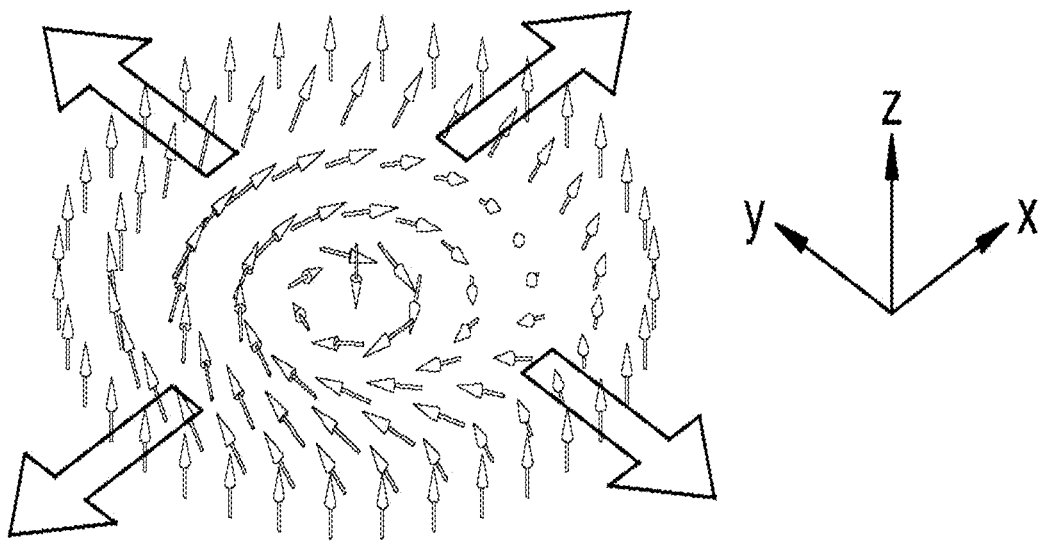
FIGS. 2A to 2C show a breathing mode of a skyrmion, according to an embodiment of the present invention.
Figure 2B:
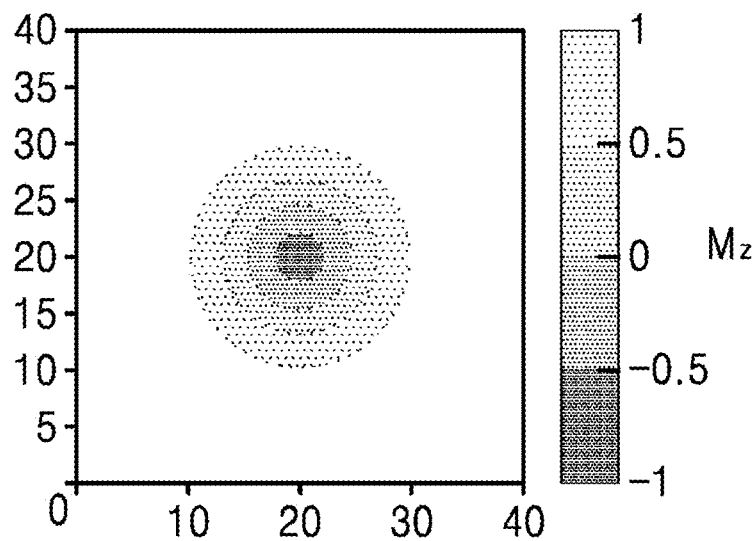
Figure 2C:
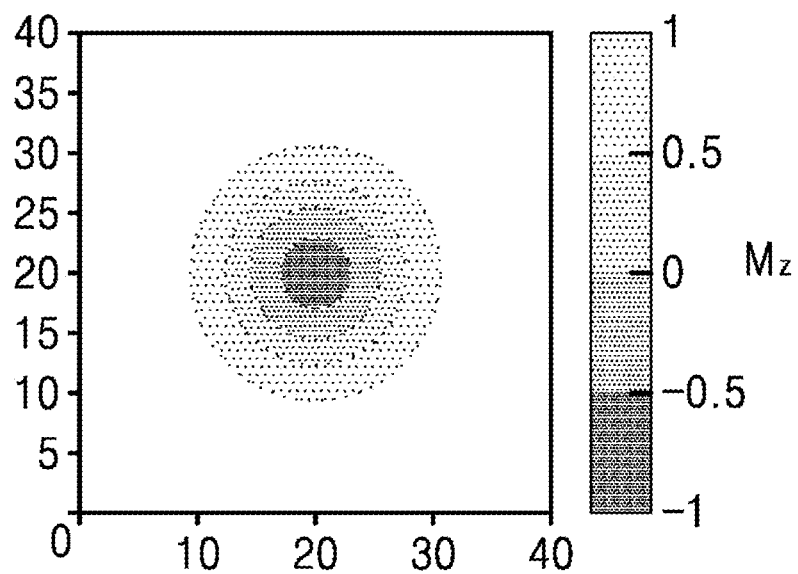
Figure 3A:
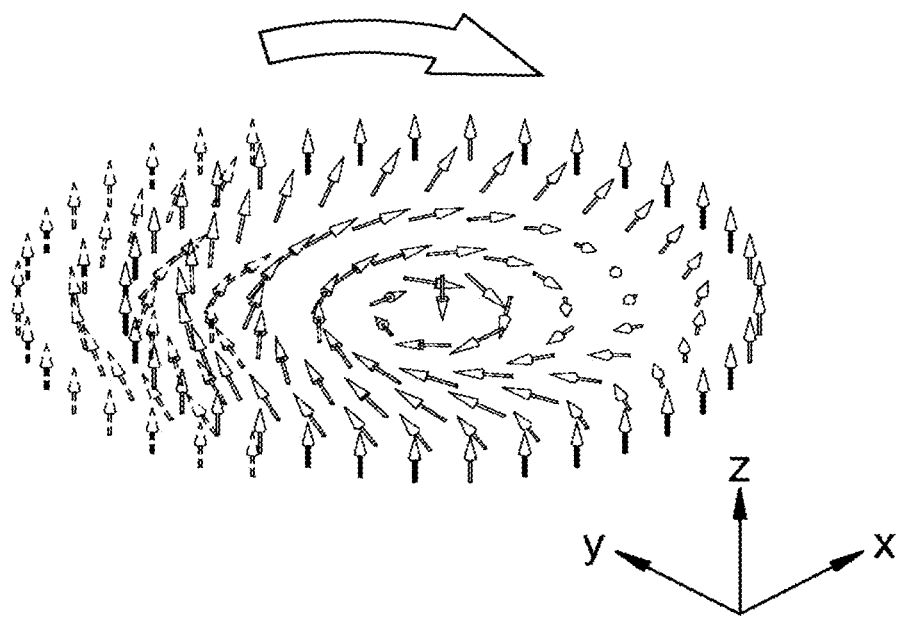
FIGS. 3A to 3D show a clockwise (CW) mode and a counterclockwise (CCW) mode of a skyrmion, according to an embodiment of the present invention.
Figure 3B:
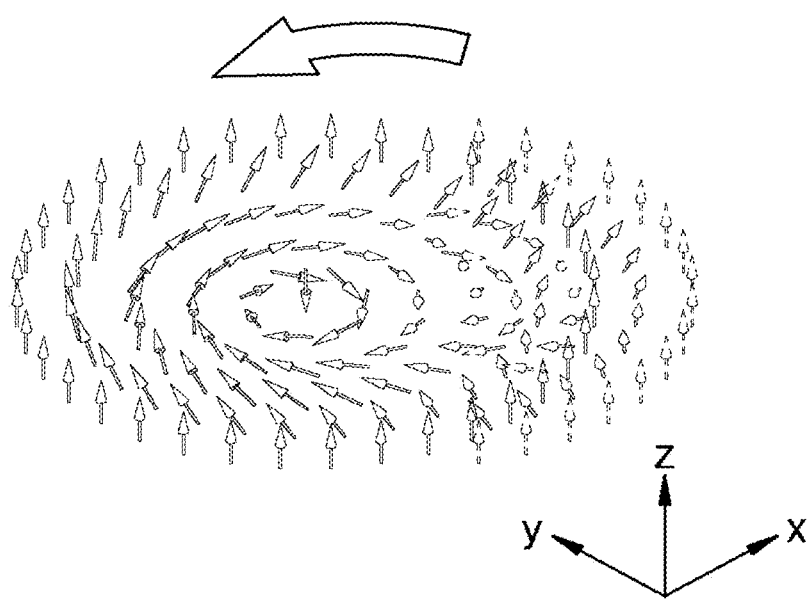
Figure 3C:
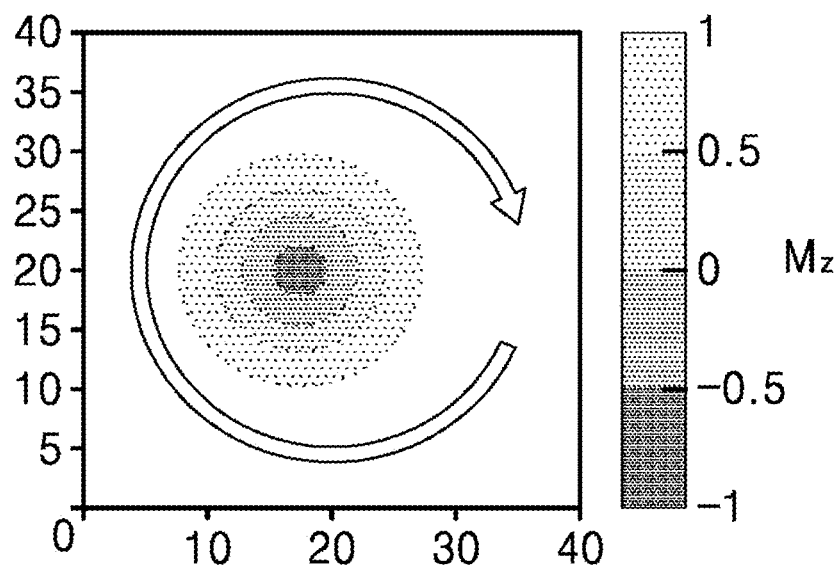
Figure 3D:
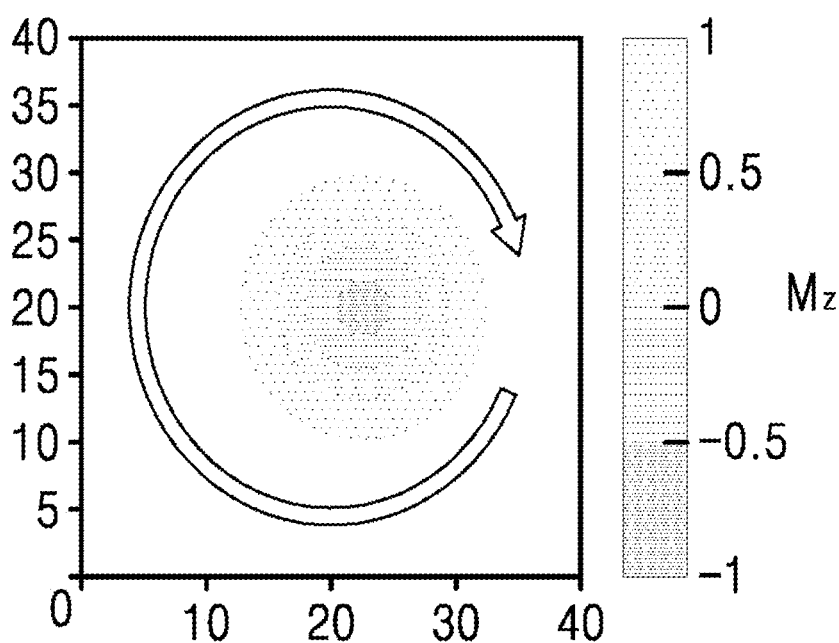
Figure 4A:
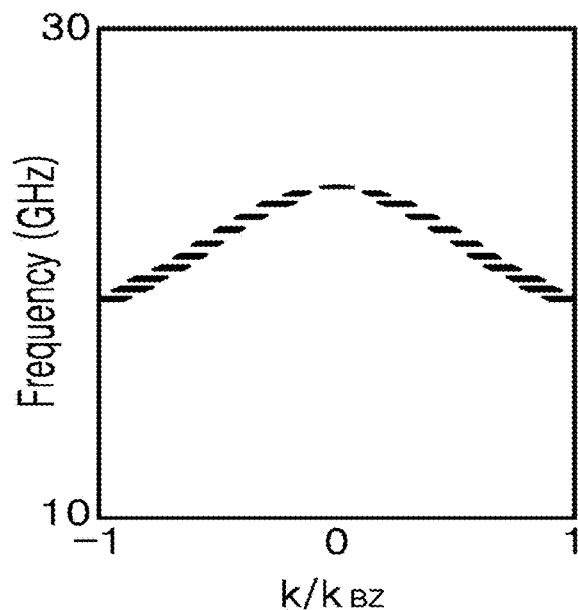
FIGS. 4A and 4B include graphs showing signal transmission by a skyrmion in a breathing mode and a CW mode, according to an embodiment of the present invention.
Figure 4B:
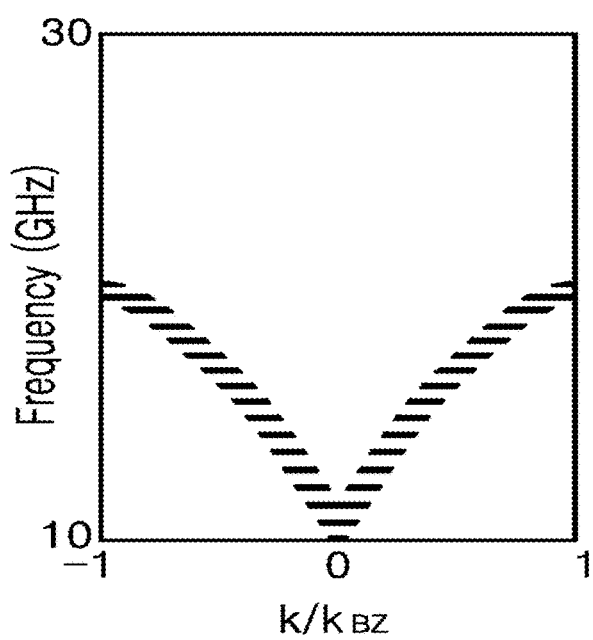

FIGS. 2A to 2C show a breathing mode of a skyrmion, according to an embodiment of the present invention. FIG. 2A shows a change in position of a core in the breathing mode, and FIG. 2B and FIG. 2C show minimum and maximum sizes of the core in the breathing mode. FIGS. 3A to 3D show a CW mode and a CCW mode of a skyrmion, according to an embodiment of the present invention. FIG. 3A shows a change in position of a core in the CW mode, FIG. 3B shows a change in position of the core in the CCW mode, and FIG. 3C to FIG. 3D show changes in position of the core in the CW mode. FIGS. 4A and 4B include graphs showing signal transmission by a skyrmion in a breathing mode and a CW mode, according to an embodiment of the present invention.

Referring to FIGS. 2 and 4, as one of the eigenmodes of the skyrmion, the breathing mode in which the core periodically expands and contracts is excited when an alternating current (AC) magnetic field or an AC current is applied in a direction perpendicular to the skyrmion (e.g., a Z-axis direction).

Referring to FIGS. 3 and 4, as the other of the eigenmodes of the skyrmion, the CW (or CCW) mode in which the core gyrates in a CW (or CCW) direction is excited when an AC magnetic field or an AC current is applied in a plane where the skyrmion is formed (e.g., an XY plane).

Core Magnetization Reversal Method of Skyrmion

Figure 8A:
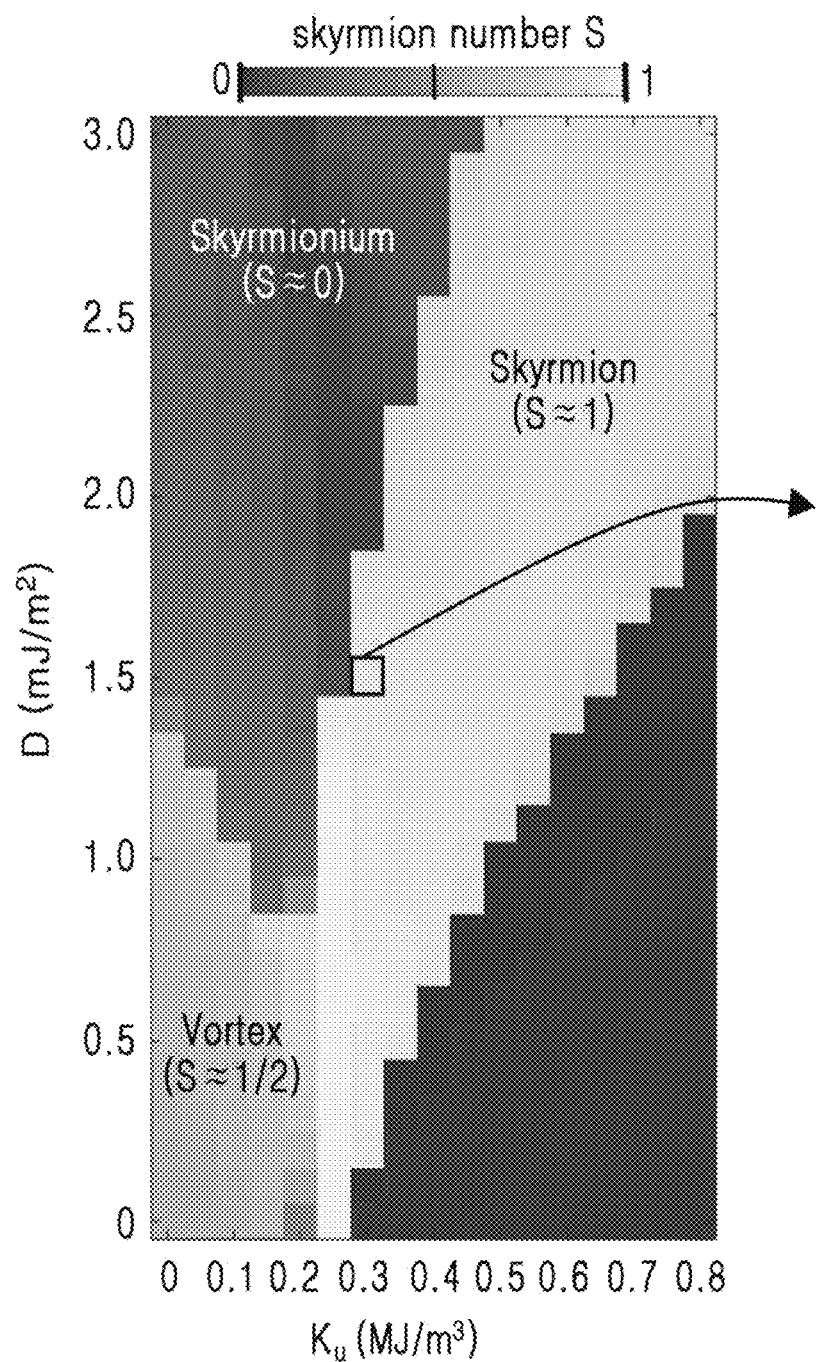
FIGS. 8A and 8B show various spin structures formable on a hemispherical shell based on material parameters, according to an embodiment of the present invention.
Figure 8B:
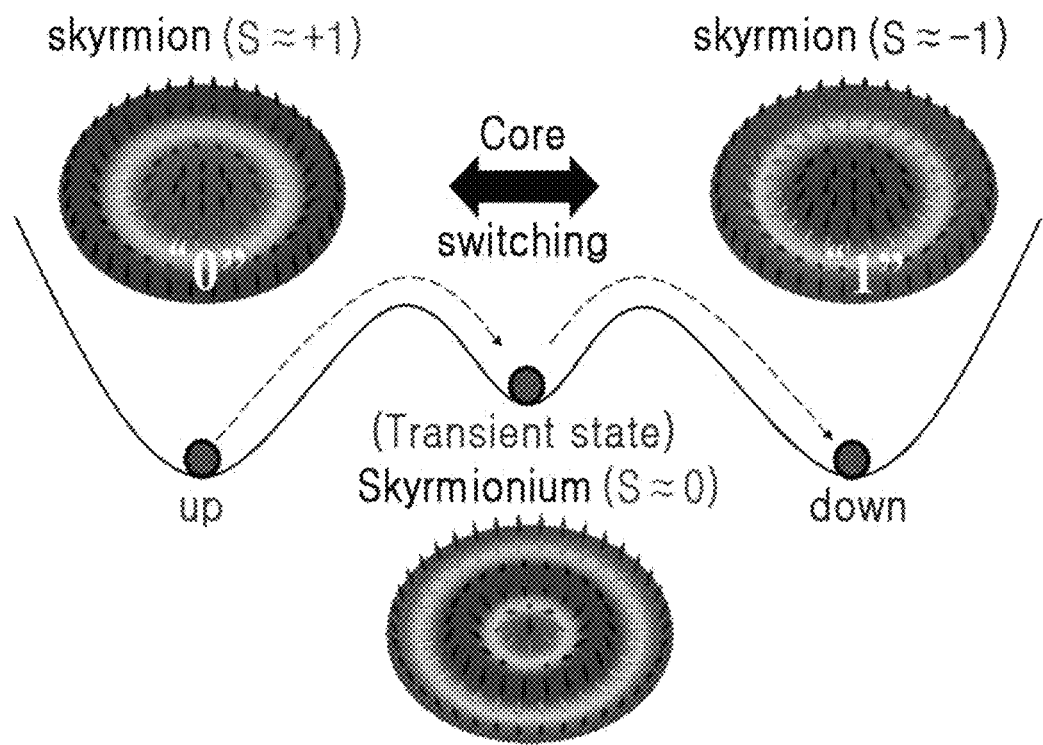

Because a memory device of "0" and "1" is implementable based on a core magnetization direction of a skyrmion, reversal of the core magnetization direction is required to control the same. For core magnetization reversal, a skyrmion number:

$$S = \int\int_A (1/4\pi) m \cdot (\partial_X m \times \partial_Y m) dX dY$$

changes from +1 to −1 and thus unavoidably passes a period of a value 0 (see, e.g., FIG. 8B).

Figure 5A:
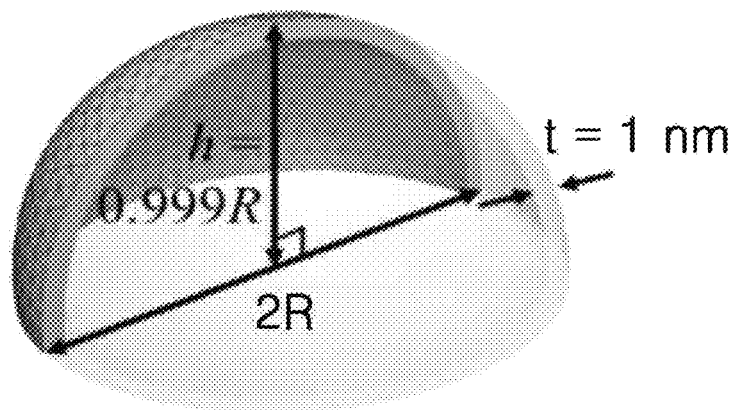
FIGS. 5A to 5D show a model system for reversing core magnetization of a skyrmion, according to an embodiment of the present invention.
Figure 5B:
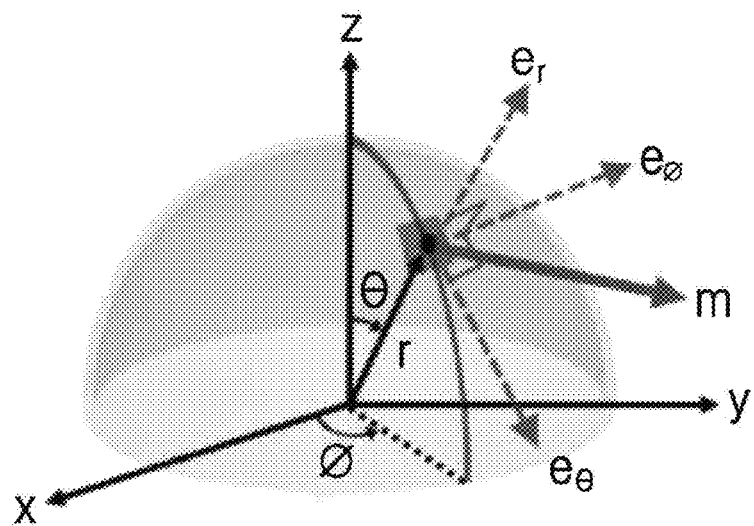
Figure 5C:
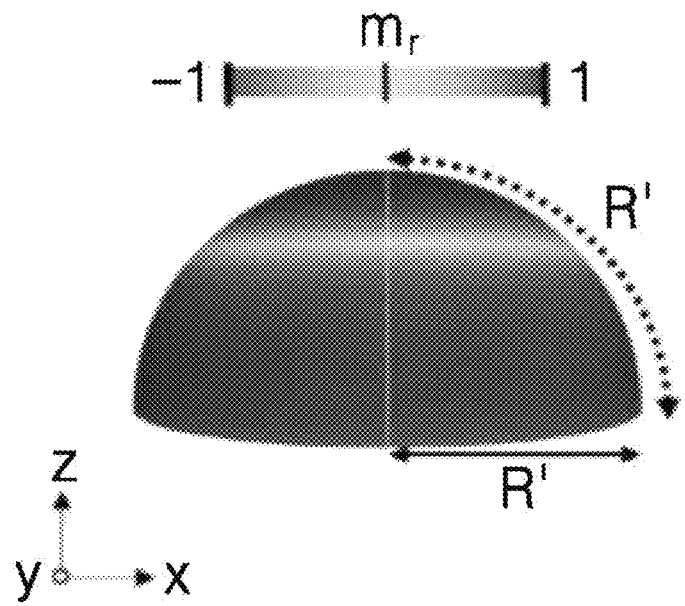
Figure 5D:
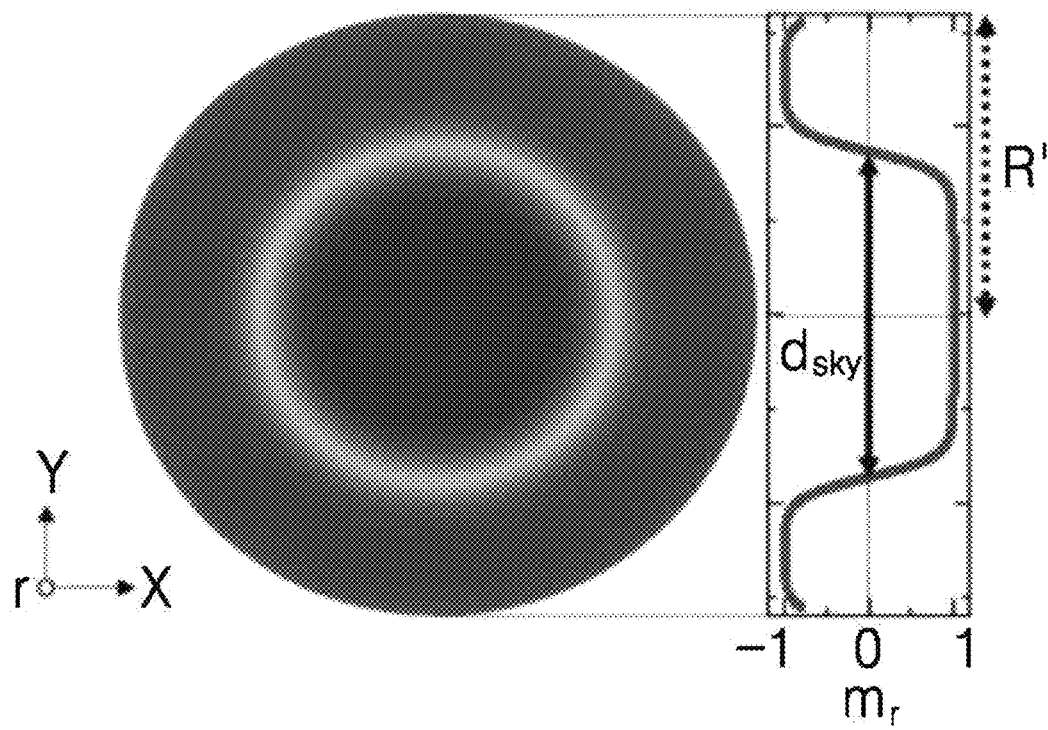

FIGS. 5A to 5D show a model system for reversing core magnetization of a skyrmion, according to an embodiment of the present invention. FIG. 5A is a perspective view of the model system, FIG. 5B shows spherical coordinates of three unit vectors in a reference frame of a local surface for local magnetization m, FIG. 5C shows a single Neel skyrmion on a hemispherical shell of 2R=100 nm, and FIG. 5D shows a planar disk equivalent to FIG. 5C.

In this specification, stabilization of topological magnetic textures of a skyrmion and a skyrmionium on a magnetic hemispherical shell will be described in relation to a perpendicular magnetic anisotropy (PMA) constant $K_u$, a Dzyaloshinskii-Moriya interaction (DMI) constant $D_{int}$, and a shell diameter 2R.

Referring to FIG. 5A, the model system is an ultra-thin (t=1 nm) hemispherical shell structure having an outer diameter 2R that varies in a range from 25 nm to 100 nm. Any other hemispherical shell structure having a diameter 2R less than or equal to 100 nm (and greater than 0 nm) may also be used. A height h is set to be 99.9% of a radius R to place a single skyrmion at the center. Such asymmetry does not affect overall static and dynamic properties of the skyrmion.

The hemispherical shell may be produced by stacking a first layer including platinum (Pt), nickel (Ni), or palladium (Pd) and a second layer including a ferromagnetic material, on a membrane having a plurality of protrusions. Specifically, the membrane may be formed by placing, on a porous membrane, a spherical particle corresponding to the diameter of the hemispherical shell, and the first and second layers may be stacked on the membrane to produce the hemispherical shell. For example, the hemispherical shell may be produced by forming a curved-surface dot template with a two-dimensional (2D) array of polystyrene spheres on a porous alumina membrane, and stacking a cobalt (Co)/Pt layer thereon. The skyrmion may be formed on the hemispherical shell by using a magnetic tip, a skyrmion-inducing Hall voltage, or the like.

To calculate individual magnetization at every node of the hemispherical shell structure, a micromagnetic simulation may be performed using 'magnum.fe' code used in the Landau-Lifshitz-Gilbert (LLG) equation expressed as Equation (1):

$$\partial M/\partial t = -\gamma M \times H_{eff} + (\alpha/M_s) M \times \partial M/\partial t,$$

where α denotes the Gilbert damping constant, γ denotes a gyromagnetic ratio, and $H_{eff}$ denotes an effective field, is a sum of all fields acting on M, and can be calculated as a negative variational derivative of a total energy density $E_{tot}$ for magnetization:

$$(H_{eff} = -\partial E_{tot}/\partial M).$$

The total energy $E_{tot}$ is expressed as Equation (2):

$$E_{tot} = E_{ms} + E_{ani} + E_{ex} + E_{DMI} + E_{zeeman},$$

where $E_{ms}$ denotes magnetostatic energy, $E_{ani}$ denotes anisotropy energy, $E_{DMI}$ denotes DMI energy, and $E_{zeeman}$ denotes Zeeman energy.

Parameters for Pt in contact with Co include a saturation magnetization $M_s$=580 kA/m, an exchange stiffness $A_{ex}$=15 pJ/m, a uniaxial PMA constant $K_u$=0 MJ/m³ to 0.8 MJ/m³, an interfacial DMI constant $D_{int}$=−8.0 mJ/m² to 8.0 mJ/m², and a damping constant α=0.3. For example, changes in spin texture are observed by varying $K_u$ and $D_{int}$ within the ranges of $K_u$=0 MJ/m³ to 0.8 MJ/m³ and $D_{int}$=−8.0 mJ/m² to 8.0 mJ/m².

As shown in FIG. 5B, for convenience of analysis, data on the local energy surface is transformed from Cartesian coordinates (x, y, z) into spherical coordinates ($e_r$, $e_\theta$, $e_\varphi$). A unit vector of the local magnetization is expressed as:

$$(m_r, m_\theta, m_\varphi) = (m \cdot e_r, m \cdot e_\theta, m \cdot e_\varphi),$$

where r denotes a radial distance, θ denotes a polar angle, and φ denotes an azimuthal angle in the local spherical reference frame.

FIG. 5C shows a single skyrmion formed on the hemispherical shell having 2R=100 nm and t=1 nm at $K_u$=0.80 MJ/m³ and $D_{int}$=3.0 mJ/m². FIG. 5D shows a planar disk equivalent to FIG. 5C, and R' denotes a radius of the planar disk. Hereinafter, spatial distribution of all local magnetizations and topological charges will be represented on a 2D planar disk.

Figure 6A:
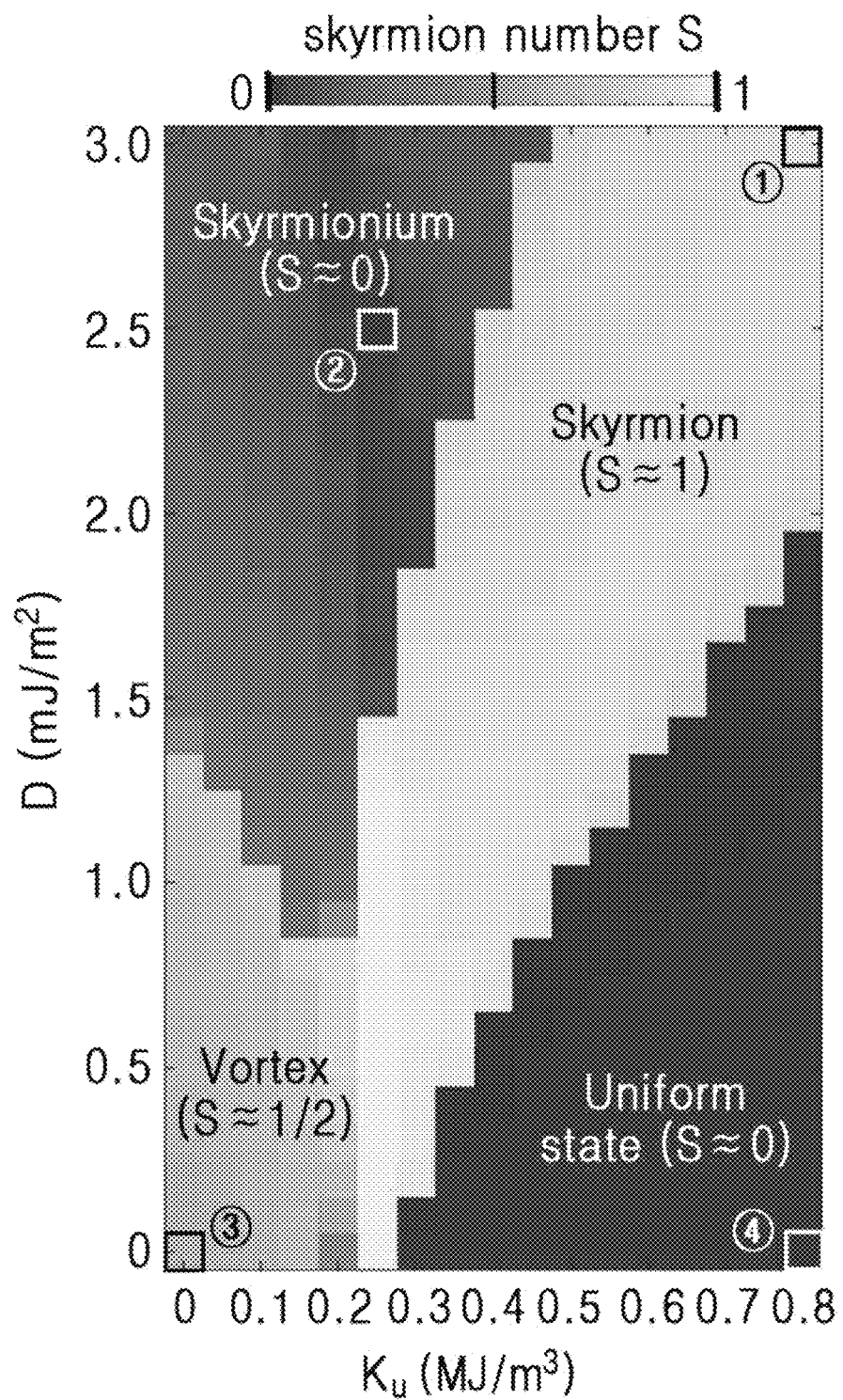
FIGS. 6A and 6B show topology based on a skyrmion number and a ground state at corresponding $D_{int}$ and $K_u$, according to an embodiment of the present invention.
Figure 6B:
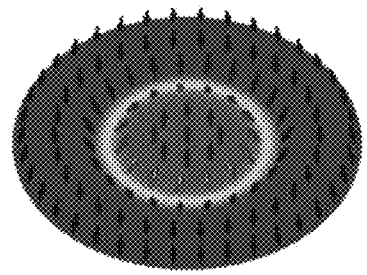
Figure 6B:
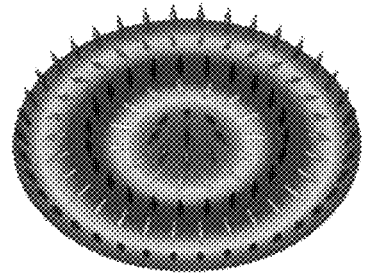
Figure 6B:
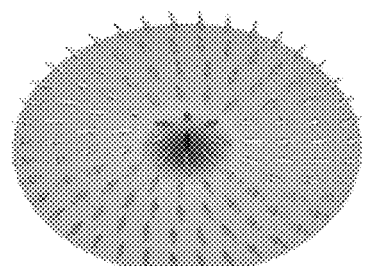
Figure 6B:
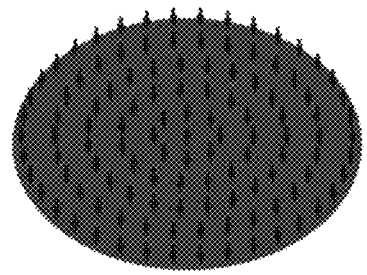
Figure 6B:
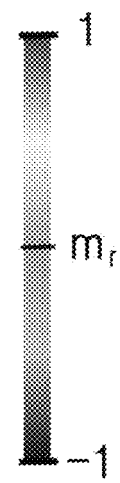

FIGS. 6A and 6B show topology based on a skyrmion number and a ground state at corresponding $D_{int}$ and $K_u$, according to an embodiment of the present invention. Because PMA prefers collinear magnetization but intrinsic DMI performs non-collinear chiral magnetization, various spin textures are formed in a ground state of a hemispherical shell having a given diameter based on PMA and DMI. According to a phase diagram of FIG. 6A, the spin textures are classified into ① skyrmion, ② skyrmionium, ③ vortex, and ④ uniform perpendicular magnetization states. As shown in FIG. 6B, the skyrmion, skyrmionium, vortex, and uniform perpendicular magnetization states are defined by skyrmion numbers of S=1, S=0, S=½, and S=0.

At low $D_{int}$ and low $K_u$, a vortex state having a magnetization configuration including out-of-plane magnetization at the core and in-plane magnetic moments radially pointing the core in the background is formed. The vortex state is modified based on $D_{int}$ and $K_u$, and a size of the vortex core is increased when $D_{int}$ and $K_u$ are increased. At higher $D_{int}$ and $K_u$, a skyrmion state may be stabilized, and out-of-plane magnetization is favorable in most areas (i.e., upward at the core and downward in the background).

When $K_u$ is reduced and $D_{int}$ is increased, a size of the skyrmion core is increased. It may be noted that an intrinsic DMI-free ($D_{int}$=0) skyrmion exists even at $K_u$=0.25 MJ/m³. At $D_{int}$ higher than or $K_u$ lower than the skyrmion phase, a skyrmionium structure in which magnetization is directed upward at the center, downward in the middle, and upward at the edge is formed.

At low $D_{int}$ and high $K_u$, the spin texture abruptly changes to a uniform state fully saturated using perpendicular magnetization at every local surface of the hemispherical shell, thereby overcoming in-plane dipolar interaction. In this case, compared to the skyrmionium, the skyrmion number is almost the same (i.e., 0) but the magnetization state is totally different.

Figure 7:
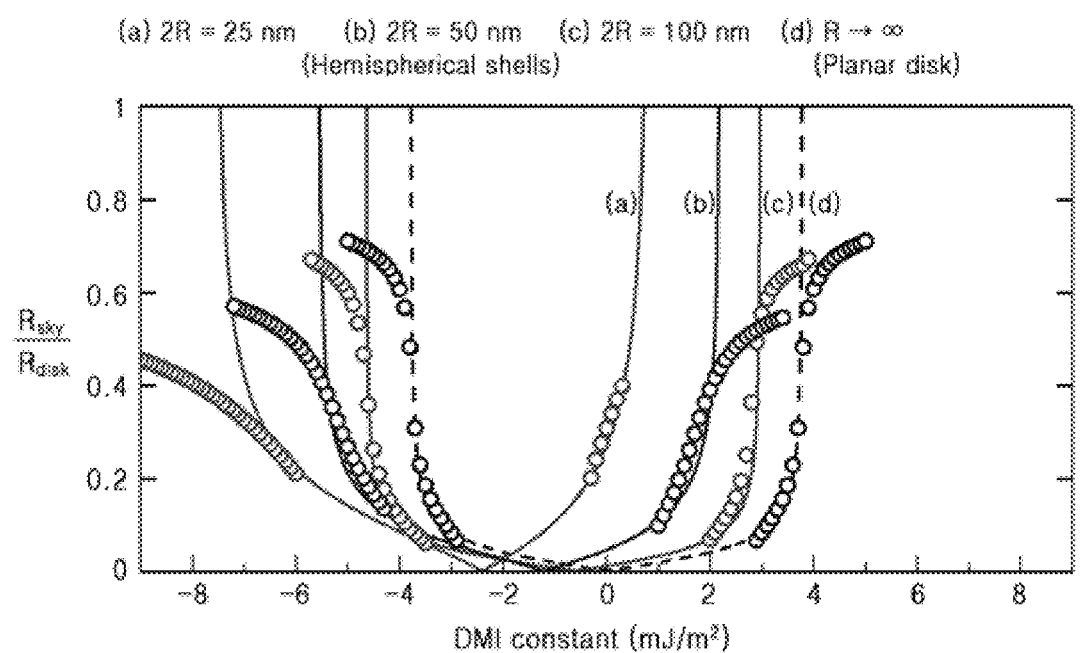
FIG. 7 is a graph showing stability of a skyrmion based on a shell diameter, according to various embodiments of the present invention.

FIG. 7 is a graph showing stability of a skyrmion based on a shell diameter, according to various embodiments of the present invention. An effective PMA $K_{eff}$ and an effective DMI $D_{eff}$ are expressed as Equation (3):

$$K_{eff} = K_u - \frac{1}{2}\mu_0 M_s^2 - \frac{D_{int}}{R} - \frac{A_{ex}}{R^2},$$

$$D_{eff} = D_{int} + \frac{2A_{ex}}{R}$$

In a planar structure, R=∞ and thus $D_{eff}=D_{int}$. On the other hand, in a curved-surface structure such as a hemispherical shell, the effective DMI $D_{eff}$ may be increased and the effective PMA $K_{eff}$ may be reduced when R is reduced. As such, stability of the magnetic skyrmion is increased in the curved-surface structure compared to the planar structure. In FIG. 7, the DMI value for the planar structure of R=∞ (graph (d)) is shown in a symmetrical shape but is shifted leftward when the curvature is increased. In particular, because a $R_{sky}/R_{disk}$ value (i.e., a ratio of a skyrmion diameter to a disk diameter) is exhibited even at D=0 when the curvature is increased, that is, when 2R changes to 100 nm (graph (c)), 50 nm (graph (b)), and 25 nm (graph (a)), it is shown that the skyrmion may stably exist even at D=0.

FIGS. 8A and 8B show various spin structures formable on a hemispherical shell based on material parameters, according to an embodiment of the present invention. A method of inducing core magnetization reversal is performed using the changes in spin texture at given $D_{int}$ and $K_u$ as described above in relation to FIGS. 6A, 6B and 7. As shown in FIGS. 8A and 8B, both of skyrmion and skyrmionium structures may stably exist under a condition of a boundary between the two states. For core magnetization reversal, a skyrmion number changes from +1 to −1 and thus unavoidably passes a period of a value 0. Therefore, in the following description, reversal of core magnetization of the magnetic skyrmion is induced with low energy through resonant excitation of each mode.

Figure 9A:
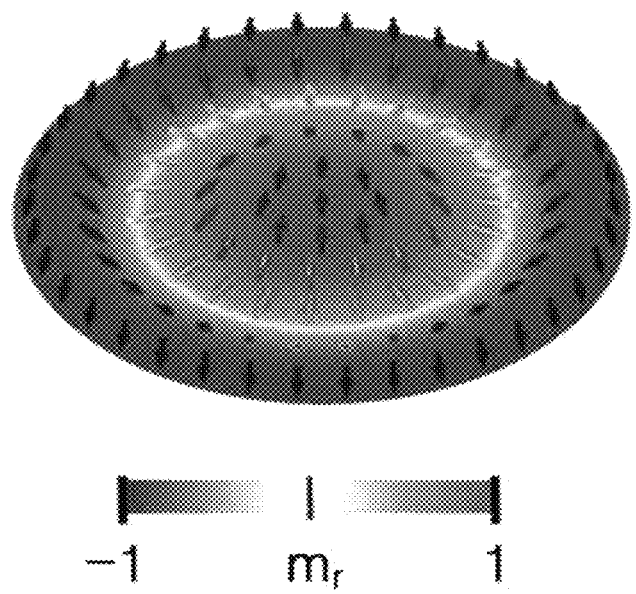
FIGS. 9A to 9C show a result of analyzing spin-wave modes of a skyrmion, according to an embodiment of the present invention.
Figure 9B:
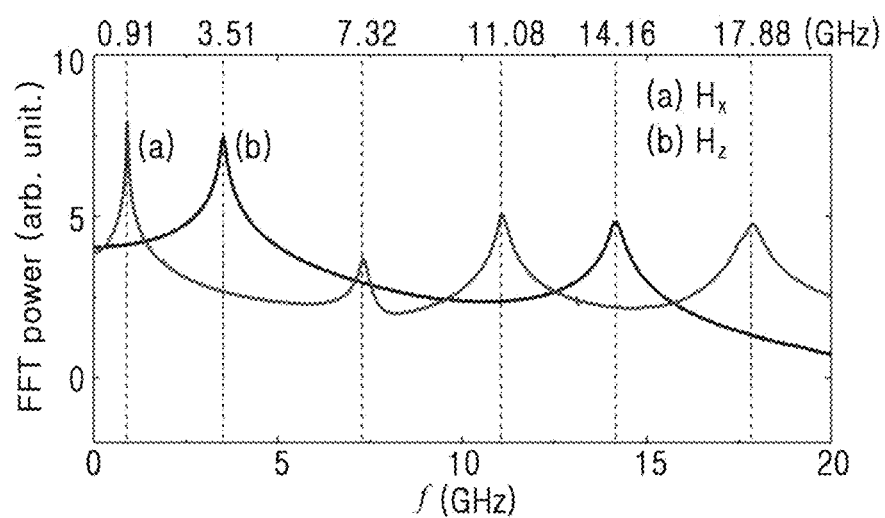
Figure 9C:
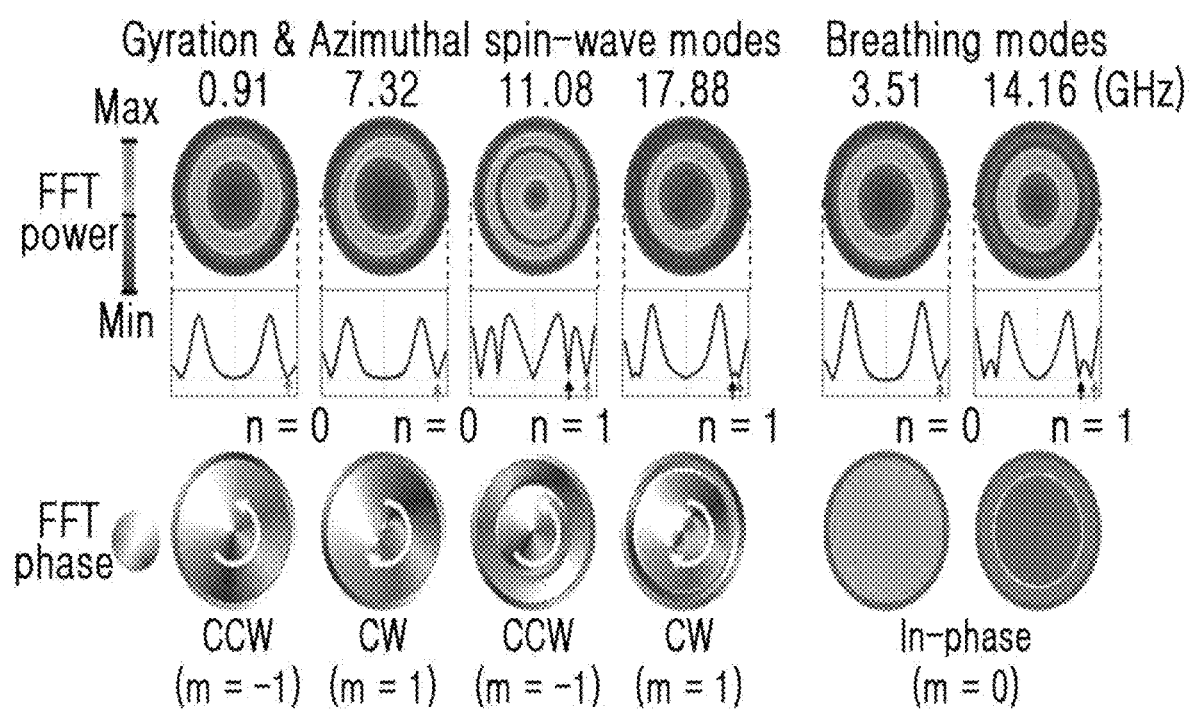
Figure 10A:
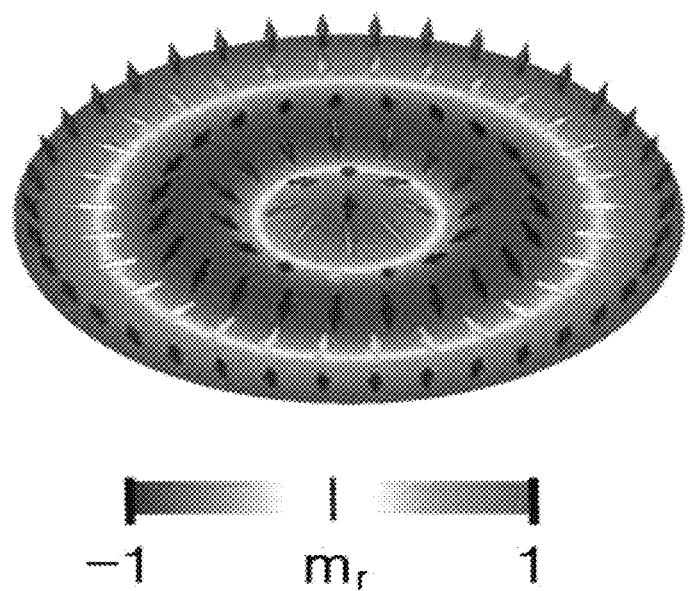
FIGS. 10A to 10C show a result of analyzing spin-wave modes of a skyrmionium, according to an embodiment of the present invention.
Figure 10B:
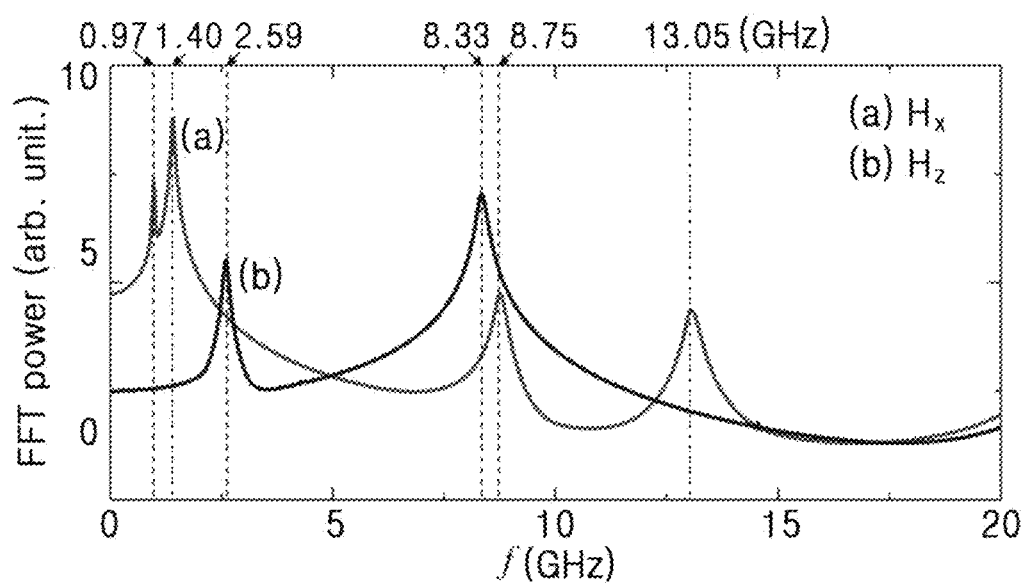
Figure 10C:
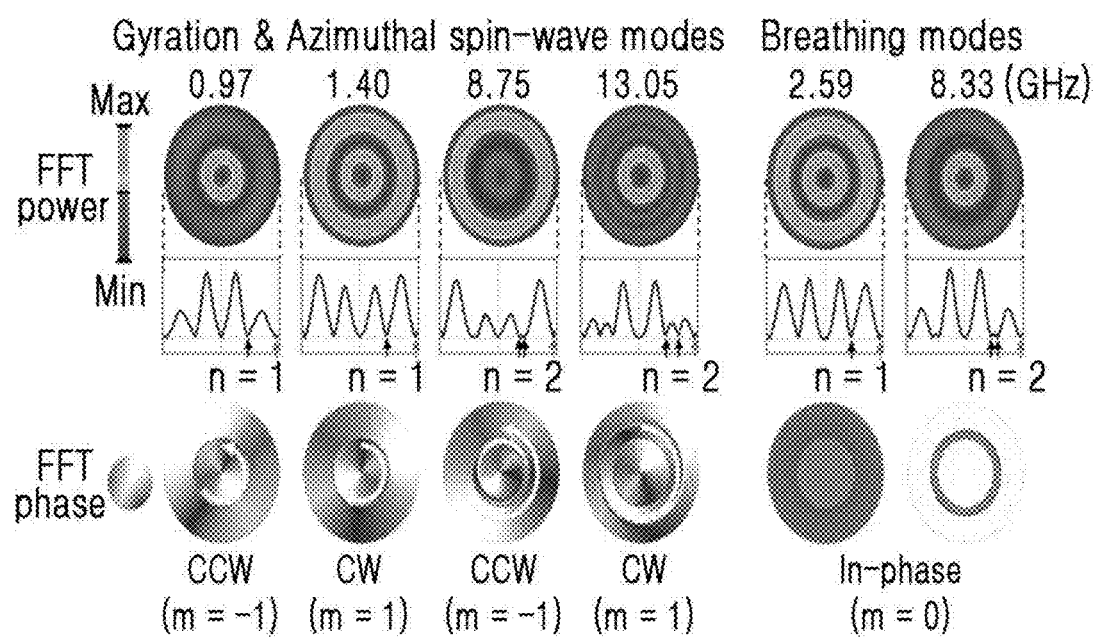

FIGS. 9A to 9C show a result of analyzing spin-wave modes of a skyrmion, according to an embodiment of the present invention. FIGS. 10A to 10C show a result of analyzing spin-wave modes of a skyrmionium, according to an embodiment of the present invention.

In a test example of the present invention, a stable skyrmion structure formed on a hemispherical shell is determined and then dynamic behaviors driven by an AC-oscillating magnetic field under a condition of $D_{int}$=1.5 mJ/m² and $K_u$=0.3 MJ/m³ are observed. Stable skyrmion and metastable skyrmionium states may be simultaneously obtained with energies of −10.0×10⁻¹⁹ J and −11.1×10⁻¹⁹ J at given $D_{int}$ and $K_u$. $H_{sinc}$, expressed as a sinc-function field, is applied to the whole hemispherical shell structure to excite dynamic modes. Here, the sinc-function field is expressed by Equation 4:

$$H_{sinc}(t)=H_0 \sin [2\pi f_H(t-t_0)]/2\pi f_H(t-t_0)),$$

where |H₀|=10 Oe, $f_H$=100 GHz, $t_0$=1 ns, t=100 ns, and a damping constant α=0.01 may be used to increase a spectral resolution of the spin-wave modes.

FIGS. 9A to 9C and 10A to 10C show resultant spectra obtained at averaged fast Fourier transform (FFT) power of mu oscillations of all individual nodes in a total volume of a hemispherical shell of 2R=100 nm for the skyrmion and the skyrmionium. Although the same structure and the same material parameters $D_{int}$ and $K_u$ are used, the spectra of the spin-wave modes are exhibited differently depending on magnetic textures.

Referring to FIGS. 9A and 9B, in the case of the skyrmion, four individual modes of 0.91 GHz, 7.32 GHz, 11.08 GHz, and 17.88 GHz are exhibited for in-plane excitation (close to $m_r$=1) and only two modes of 3.51 GHz and 14.16 GHz are exhibited for out-of-plane excitation (close to $m_r$=−1).

Referring to FIGS. 10A and 10B, in the case of the skyrmionium, similarly to the skyrmion, four resonance modes of 0.97 GHz, 1.40 GHz, 8.75 GHz, and 13.05 GHz are exhibited for in-plane excitation (close to $m_r$=1) and only two resonance modes of 2.59 GHz and 8.33 GHz are exhibited for out-of-plane excitation (close to $m_r$=−1).

In excitation of the skyrmion, the strongest mode is exhibited at the lowest resonance frequency. That is, the strongest in-plane excitation mode is exhibited at 0.91 GHz and the strongest out-of-plane excitation mode is exhibited at 3.51 GHz. On the other hand, in excitation of the skyrmionium, the strongest mode is exhibited at the second resonance frequency. That is, the strongest in-plane excitation mode is exhibited at 1.40 GHz and the strongest out-of-plane excitation mode is exhibited at 8.33 GHz.

FIG. 9C and FIG. 10C show spatial distribution of FFT powers and phases of local mu oscillations at resonance peaks to identify all excitation modes. A power line profile crossing the center of the skyrmion or the skyrmionium along a radial axis thereof clearly shows positions and the number of radial nodes n as indicated by black arrows, and the phase distribution shows positions and the number of nodes along an azimuthal direction m. A node at a shell edge (indicated by a gray arrow) in all excitation modes is excluded from the number of radial nodes n, because such node is caused not by a real eigenmode of the skyrmion state but by the edge effect and curvature-induced DM-like interaction of the shell.

It may be noted that the number of radial nodes n of the skyrmionium is always one more than that of the skyrmion, because the skyrmionium consists of inner and outer skyrmions and a circular domain wall intervenes therebetween as a source of an additional node. Therefore, the excitation modes of the skyrmion and the skyrmionium in FIG. 9C and FIG. 10C may be indexed by both n and m. In the in-plane excitation eigenmodes, two low-frequency modes are indexed by n=0 (or n=1) and two high-frequency modes are indexed by n=1 (or n=2). The two modes corresponding to each value of n are further indexed by m=−1 and m=+1 by sensing phase changes between −π and π and CCW and CW gyrations. In the out-of-plane excitation modes, the number of radial nodes is n=0 or 1 (or n=1 or 2) but the same azimuthal node of m=0 is used.

Figure 11A:
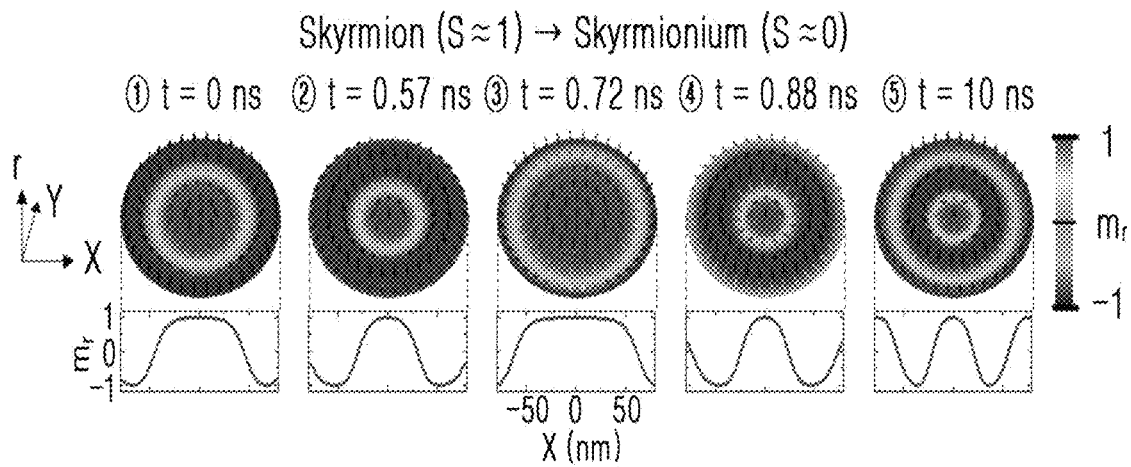
FIGS. 11A and 11B show transformation from a skyrmion into a skyrmionium, according to an embodiment of the present invention.
Figure 11B:
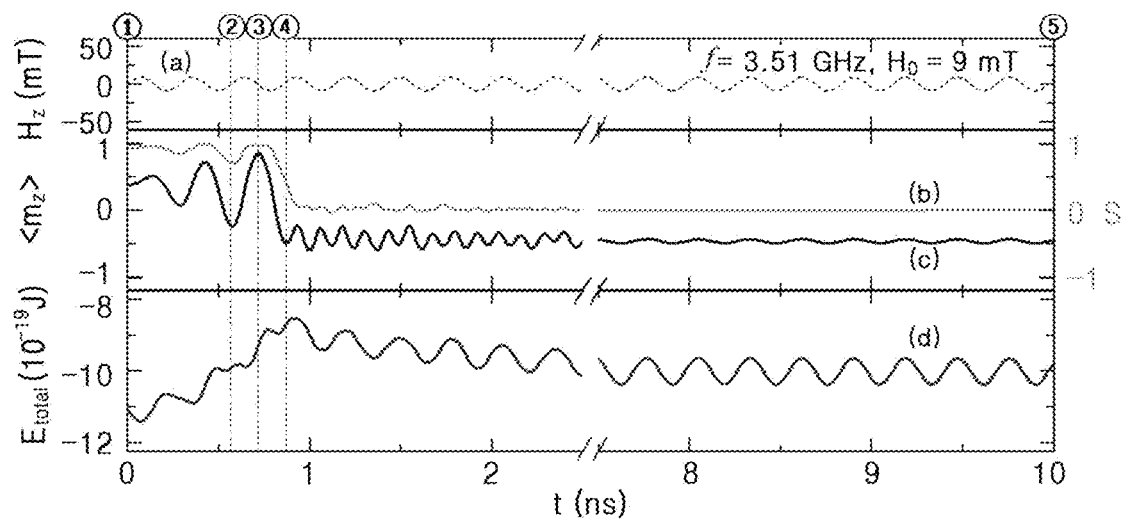
Figure 12A:
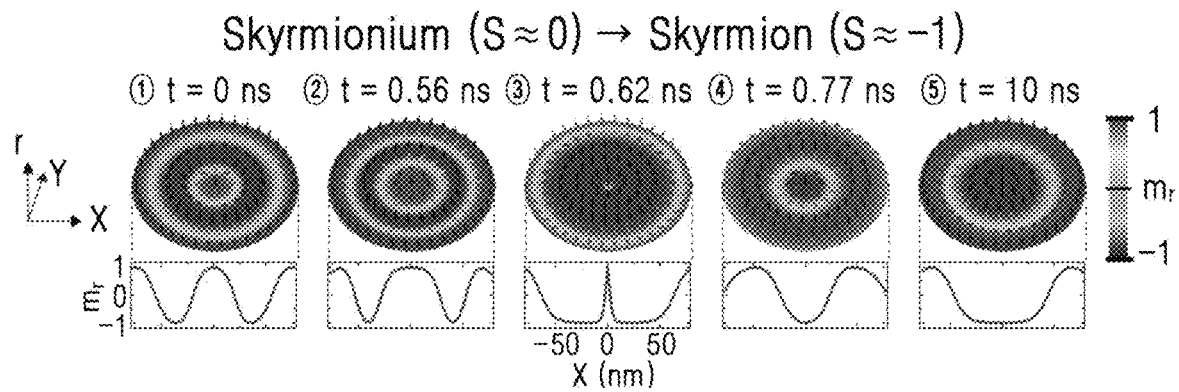
FIGS. 12A and 12B show transformation from a skyrmionium into a skyrmion, according to an embodiment of the present invention.
Figure 12B:
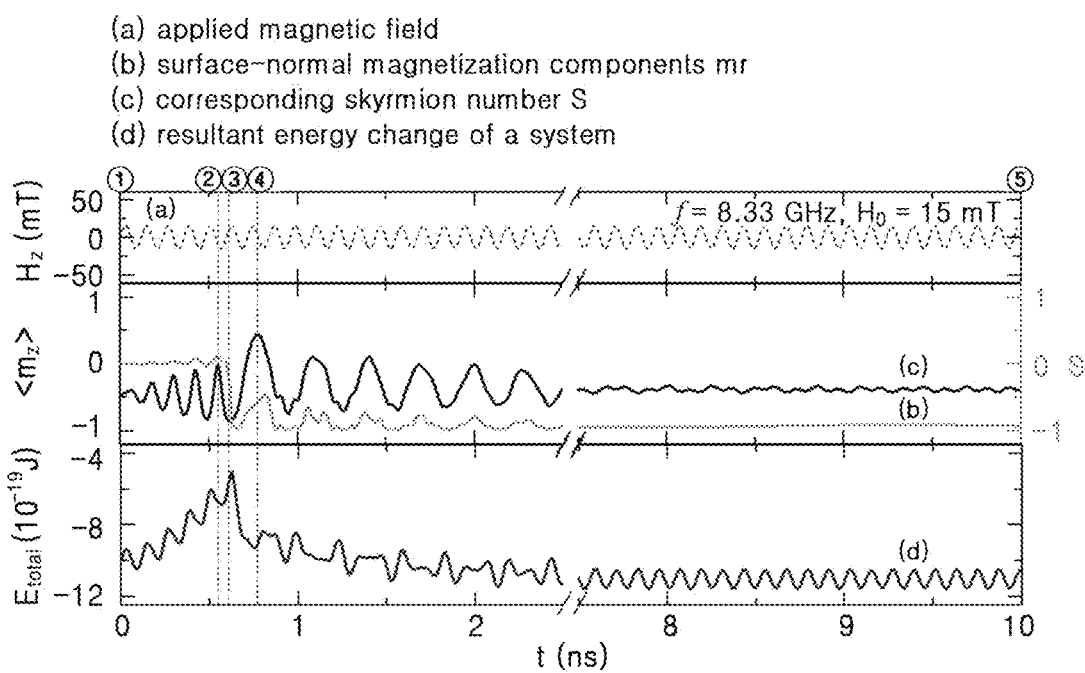

FIGS. 11A and 11B show transformation from a skyrmion into a skyrmionium, according to an embodiment of the present invention. FIGS. 12A and 12B show transformation from a skyrmionium into a skyrmion, according to an embodiment of the present invention.

After determination of a mode intrinsic frequency on a hemispherical shell, breathing mode dynamics to auxiliary polarity switching by a single harmonic oscillating field $H(t)=H_{AC} \sin (2\pi f_{res} t)$ applied in a z direction will now be described (where $f_{res}$ and $H_{AC}$ denote a frequency and an amplitude of the field, respectively).

As illustrated in FIG. 11A and FIG. 12A, a dynamic process leading to skyrmion polarity switching may be clearly identified based on temporal evolution a mu profile of the shell. As illustrated in FIG. 11B and FIG. 12B, transformed states may be classified using an applied magnetic field (indicated by graph (a)), surface-normal magnetization components mu (indicated by graph (b)), a corresponding skyrmion number S (indicated by graph (c)), and a resultant energy change of a system (indicated by graph (d)).

FIGS. 11A and 11B show a switching process of a skyrmion having S=+1 and driven by $H_{AC}$=9 mT and $f_{res}$=3.51 GHz. The skyrmion starts to breathe in response to an AC magnetic field. That is, a core of the skyrmion contracts (t=0.57 ns) when the field is applied in a negative z direction and expands (t=0.72 ns) when the field is applied in a positive z direction. After that, a spin tilted at the edge of the shell is reversed from downward to upward and reaches a transient state (t=0.88 ns). Finally, the system enters damping oscillation and becomes a stable skyrmionium state (t=10 ns). When the initial skyrmion state (S=+1) is transformed into the skyrmionium state (S=0), the resonance frequency of the skyrmion does not act as a resonance frequency for the skyrmionium. Therefore, when magnetization oscillation is slowed down, the switching process may be terminated. As described above, the lowest breathing-mode resonance frequencies of the skyrmion and the skyrmionium are different, i.e., 3.51 GHz and 2.59 GHz.

FIGS. 12A and 12B show a switching process of a skyrmionium having S=0 and driven by $H_{AC}$=15 mT and $f_{res}$=8.33 GHz. A high-order breathing mode (n=2, m=0) occurs at a position where gyrations of both of the periphery of an inner skyrmion and the edge of the structure are excited, in response to an AC magnetic field. The skyrmionium starts to breathe similarly to the skyrmion. That is, a core of the skyrmionium expands (t=0.56 ns) when the field is applied in a positive z direction and contracts (t=0.62 ns) when the field is applied in a negative z direction. Immediately after that, a core of the inner skyrmion disappears and the skyrmionium is transformed into a skyrmion having downward polarity (t=0.77 ns). When such core reversal occurs, high-frequency spin waves are emitted from the center of the core to disperse the highest stored energy to a surrounding region of the core (see a lower part of FIG. 12B). When the initial skyrmionium state (S=0) is transformed into the skyrmion state (S=−1), the resonance frequency of the skyrmionium does not act as a resonance frequency for the skyrmion. Therefore, when the skyrmion number converges to a stable value (S=−1), no more switching occurs. As described above, the second breathing-mode resonance frequencies of the skyrmion and the skyrmionium are different, i.e., 14.16 GHz and 8.33 GHz.

Figure 13:
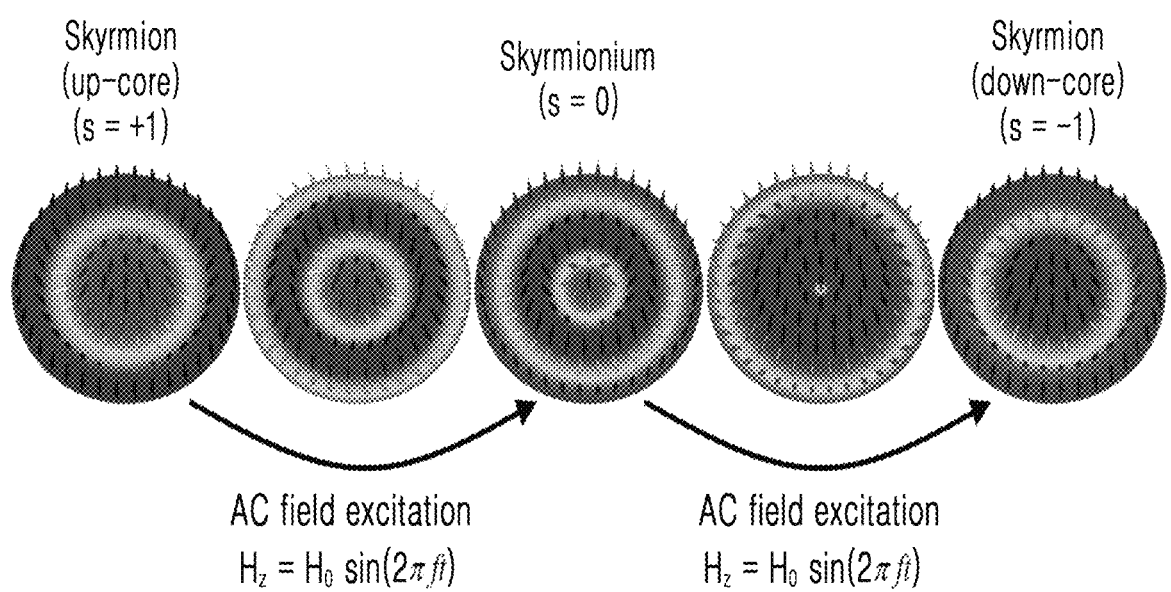
FIG. 13 shows a core magnetization reversal process of a skyrmion, according to an embodiment of the present invention.

FIG. 13 shows a core magnetization reversal process of a skyrmion, according to an embodiment of the present invention. In particular, FIG. 13 summarizes FIGS. 9A, 9B, 9C, 10A, 10B, 10C, 11A, 11B, 12A and 12B, and shows that a first skyrmion (S=+1) is transformed into a skyrmionium (S=0) due to excitation caused by a first AC magnetic field and the skyrmionium (S=0) is transformed into a second skyrmion (S=−1) due to excitation caused by a second AC magnetic field different from the first AC magnetic field. Ultimately, a skyrmion whose core magnetization is opposite to that of an initial skyrmion may be obtained through two-step structural transformation.

Meanwhile, a combination of PMA $K_u$ and DMI $D_{int}$ for given 2R may play a critical role to form different spin textures. When 2R is reduced, a restriction in shape of a hemispherical shell may greatly affect stabilization of a skyrmion due to curvature-induced DMI-like interaction. A positive threshold $D_{int}(D_{th})$ required to stabilize the skyrmion is reduced when 2R is reduced, which shows that even an intrinsic DMI-free ($D_{int}$=0) skyrmion may be stabilized on a shell of 2R<25 nm.

A stable skyrmion nanostructure may be produced based on a calculated phase diagram of spin configurations (see FIG. 6A), and be applied to racetrack memory, a logic gate, magnetoresistive random access memory (MRAM) such as a transistor, and a spintronic device. The present invention provides not only a controlled switching process achievable at a gigahertz frequency but also a method of manufacturing a data storage device based on manipulation of a skyrmion state without applying a stabilizing magnetic field. Because a skyrmion may have an intrinsic frequency of a dynamic mode in a gigahertz range from about 1 GHz to about 99 GHz, or have an intrinsic frequency of a dynamic mode in a megahertz range from about 1 MHz to about 999 MHz when a diameter of a hemispherical shell is increased, the present invention also provides applicable fields thereof, e.g., skyrmion-based tunable resonators.

As described above, according to the present invention, stability of a skyrmion may be increased, and efficiency of DMI may be increased while reducing PMA. Core magnetization of a skyrmion formed on a hemispherical shell may be reversed within a short driving time by using a weak magnetic field less than or equal to 1,000 Oe, more specifically, less than or equal to 100 Oe.

As described above, according to an embodiment of the present invention, stability of a skyrmion may be increased, and efficiency of DMI may be increased while reducing PMA. In addition, according to an embodiment of the present invention, core magnetization of a skyrmion formed on a hemispherical shell may be reversed within a short driving time by using a weak magnetic field. However, the scope of the present invention is not limited to the above-described effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A core magnetization reversal method, comprising:
   transforming a first magnetic skyrmion into a skyrmionium by applying a first alternating current (AC) magnetic field to the first magnetic skyrmion; and
   transforming the skyrmionium into a second magnetic skyrmion by applying a second AC magnetic field to the skyrmionium;
   wherein the first magnetic skyrmion is formed on a hemispherical shell; and
   wherein the hemispherical shell is formed by:
      preparing a membrane having a plurality of protrusions; and
      stacking, on the membrane, a first layer comprising at least one of platinum (Pt), nickel (Ni), and palladium (Pd), and a second layer comprising a ferromagnetic material.

2. The method of claim 1, wherein preparing the membrane of step comprises placing a spherical particle on a porous membrane.

3. The method of claim 1, wherein the hemispherical shell has a diameter in a range from greater than 0 nm to 100 nm.

4. The method of claim 1, wherein a stability of the first magnetic skyrmion is increased when a curvature of the hemispherical shell is increased.

5. The method of claim 1, wherein the first magnetic skyrmion has a skyrmion number of +1, the second magnetic skyrmion has a skyrmion number of −1, and the skyrmionium has a skyrmion number of 0.

6. The method of claim 1, wherein a Dzyaloshinskii-Moriya interaction (DMI) constant associated with the method is greater than or equal to 0 mJ/m2 and less than or equal to 3.0 mJ/m2.

7. The method of claim 1, wherein a magnetic anisotropic constant Ku associated with the method is greater than 0 MJ/m3 and less than or equal to 0.8 MJ/m3.

8. The method of claim 1, wherein, on the hemispherical shell, an effective perpendicular magnetic anisotropy (PMA) Keff is expressed as Keff=Ku−½μ0Ms2−Dint/R−Aex/R2, and an effective DMI Deff is expressed as Deff=Dint+2Aex/R, where Ku denotes a PMA constant, Dint denotes a DMI constant, Aex denotes an exchange stiffness, and R denotes a radius of the hemispherical shell.

9. The method of claim 1, wherein the first and second AC magnetic fields have different frequencies.

10. A core magnetization reversal method, comprising:
transforming a first magnetic skyrmion into a skyrmionium by applying a first alternating current (AC) magnetic field to the first magnetic skyrmion; and
transforming the skyrmionium into a second magnetic skyrmion by applying a second AC magnetic field to the skyrmionium; and
wherein the first and second AC magnetic fields have a strength in a range from greater than Oe to 1,000 Oe, and have different frequencies in a range from 1 MHz to 99 GHz.

11. A data storage device formed using the method of claim 1.

12. A core magnetization reversal method, comprising:
transforming the first magnetic skyrmion, which is formed on a hemispherical shell, into a second magnetic skyrmion having different characteristics, by sequentially applying thereto a first alternating current (AC) magnetic field, and then a second AC magnetic field having an unequal frequency relative to the first AC magnetic field; and
wherein the first and second AC magnetic fields have frequencies ranging from 1 MHz to 99 GHz.

13. The method of claim 12, wherein the hemispherical shell is formed by:
preparing a membrane having a plurality of protrusions; and
stacking, on the membrane, a first layer comprising at least one of platinum (Pt), nickel (Ni), and palladium (Pd), and a second layer comprising a ferromagnetic material.

14. The method of claim 13, wherein the first magnetic skyrmion has a skyrmion number of +1, and the second magnetic skyrmion has a skyrmion number of −1.

* * * * *